United States Patent [19]

Pintchovski

[11] Patent Number: 5,236,874
[45] Date of Patent: Aug. 17, 1993

[54] METHOD FOR FORMING A MATERIAL LAYER IN A SEMICONDUCTOR DEVICE USING LIQUID PHASE DEPOSITION

[75] Inventor: Faivel S. Pintchovski, Austin, Tex.

[73] Assignee: Motorola, Inc., Schaumburg, Ill.

[21] Appl. No.: 666,309

[22] Filed: Mar. 8, 1991

[51] Int. Cl.$^5$ ................. H01L 21/20; H01L 21/465; B05D 5/12; B05D 5/06
[52] U.S. Cl. ................................. 437/245; 437/117; 437/92; 427/126.3; 427/126.5; 427/169
[58] Field of Search ............... 427/126.1, 126.2, 126.3, 427/126.4, 126.5, 126.6, 430.1, 434.5; 437/231, 245

[56] References Cited

U.S. PATENT DOCUMENTS

| | | | |
|---|---|---|---|
| 4,946,710 | 8/1990 | Miller et al. | 427/126.3 |
| 5,028,455 | 7/1991 | Miller et al. | 427/126.3 |
| 5,116,643 | 5/1992 | Miller et al. | 427/126.3 |

OTHER PUBLICATIONS

"The Early Transition Metals", D. L. Kepert, Academic Press, New York, 1972, pp. 18–21.
"Metal Alkoxides as Precursors for Electronic and Ceramic Materials", D. C. Bradley, Chem. Rev. (8 6, p. 1317, 1989.
"Mass-spectrometeric Investigation of the Termal-Decompostion of Various Organosilicon Compound in SiXCl-X(H) Chemical Vapor-Deposition":, J. P. Gerault, J. Anal. Appl. Pyrolysis (4), p. 59, 1982.

*Primary Examiner*—Olik Chaudhuri
*Assistant Examiner*—Ramamohan Rao Paladugu
*Attorney, Agent, or Firm*—Jasper W. Dockrey

[57] ABSTRACT

A method is provided for forming a material layer in a semiconductor device using liquid phase deposition. A material layer such as a metal layer, a dielectric layer, a semiconductor layer or a superconducting layer is deposited by the liquid-phase thermal decomposition of a metal-organic precursor dissolved in an anhydrous organic solvent. The organic solvent has a chemical polarity corresponding to the selected metal-organic precursor and has a normal boiling point above the decomposition temperature of the selected precursor. As a result of few restrictions on the range of precursor physical properties, the present invention enables the use of a wide variety of molecular compositions which can be used for the formation of an equally wide variety of material layers. In one embodiment of the invention, a semiconductor substrate is subjected to a liquid mixture comprising a metal-substituted heterocyclic acetylacetonate precursor dissolved in tetradecane (b.p. 254°C.). Depending upon the structure of the acetylacetonate, either a metal or a metal oxide film is deposited in the liquid phase on a semiconductor substrate immersed in a solution which is maintained at the decomposition temperature of the acetylacetonate precursor.

19 Claims, 1 Drawing Sheet

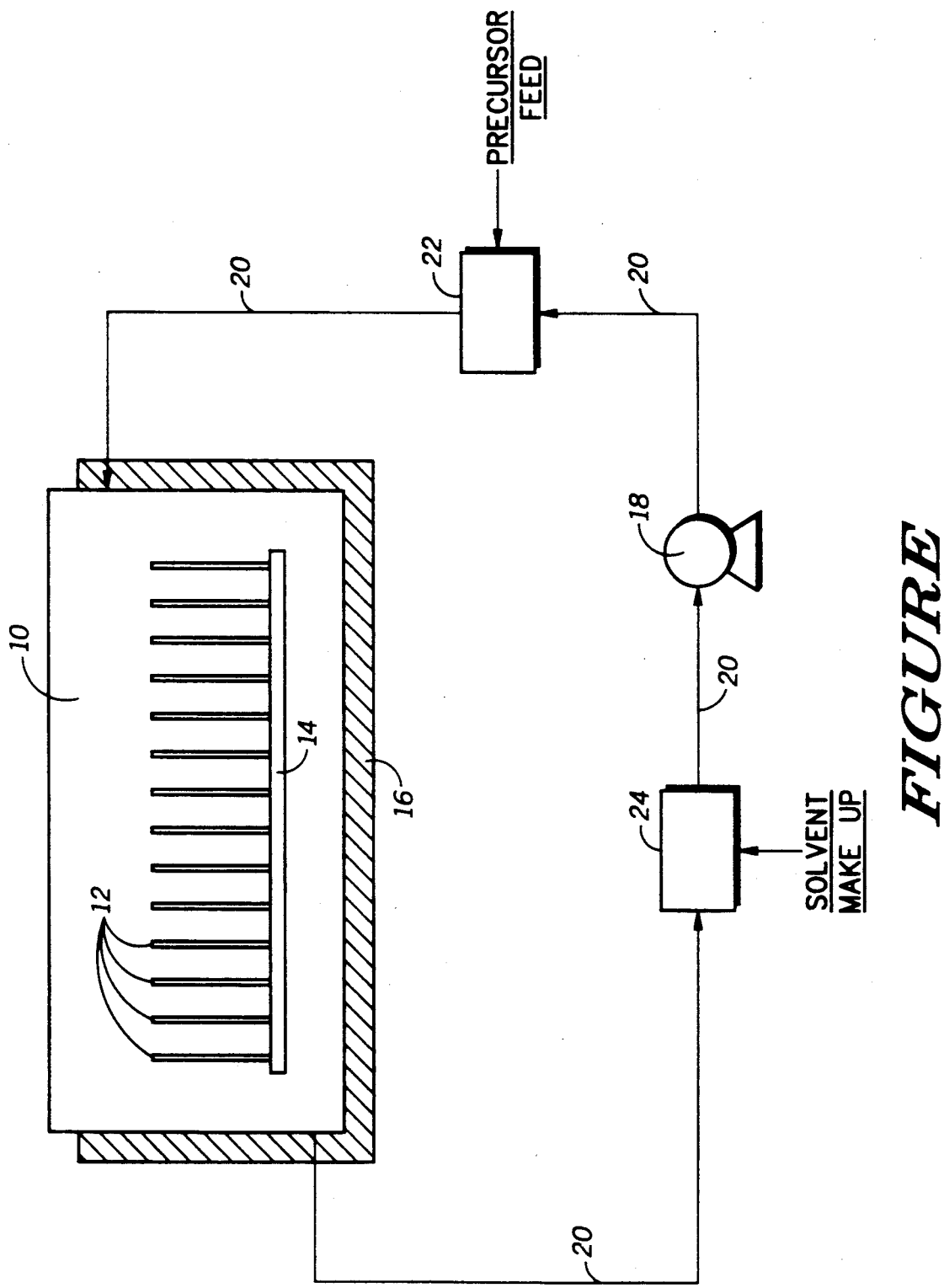

METHOD FOR FORMING A MATERIAL LAYER IN A SEMICONDUCTOR DEVICE USING LIQUID PHASE DEPOSITION

FIELD OF THE INVENTION

This invention relates in general to a method for fabricating a semiconductor device, and more particularly to a method for forming a material layer using a liquid phase deposition process.

BACKGROUND OF THE INVENTION

The semiconductor industry is characterized by a trend toward fabricating larger and more complex functions on a semiconductor chip. The larger and more complex functions are achieved by reducing device sizes and spacing and by reducing the junction depth of regions formed in the semiconductor substrate. The shallow junctions are extremely sensitive to high temperature processing and therefore manufacturers have sought to develop low temperature processes to avoid diffusing dopants in the junction regions. One major area of high temperature processing in a semiconductor fabrication process is thin film deposition. Typically thin films are formed at a high temperature in chemical vapor deposition (CVD) systems where temperatures can reach in excess of 900° C. To avoid exposure of semiconductor device substrates having shallow junctions to such high temperatures several low temperature deposition methods have been developed.

Progress in CVD technology has brought about low temperature metal-organic CVD (LTMOCVD) as one approach to fulfilling the needs for deposition of materials such as Cu, Ti and W. This method can be used to deposit a metal film in the temperature range of about 100° to 350° C. To be successful, this method requires that the organic precursors have a vapor pressure sufficient to allow reliable delivery into a reaction chamber and not condense to a solid or liquid in the delivery system. The selection of precursors having acceptably high vapor pressures has lead to an extensive effort to synthesize organic precursors having the required physical properties. This is especially difficult since most of the compounds having the structure and chemical reactivity necessary to deposit a thin film in an LTMOCVD system are solids at room temperature. Precursors which are solids at room temperature are undesirable because of their tendency, once vaporized, to condense on the surfaces of delivery system before reaching the reaction chamber. The difficult synthesis of LTMOCVD precursors has limited the number of different precursors available for use; and of course, the limited range of available precursors has been accompanied by a concomitant reduction in the range of film types which can be realized by this technique.

Recognizing the limitations inherent in LTMOCVD, liquid phase deposition (LPD) techniques have been developed as an alternative method for low temperature film deposition. One existing LPD method used for dielectric film formation employs sol-gel technology. Using sol-gel technology, a precursor, typically an alkoxide, is dissolved in the parent alcohol and then hydrolyzed under controlled conditions to produce a gel containing the hydrated metal oxide. The gel is then spun onto the substrate surface and dryed leaving a glassy dielectric material on the substrate surface. A fundamental requirement of this technique is the precursor must be highly chemically reactive with water in order to form the gel.

The requirement that the precursor readily undergo hydrolysis is also characteristic of existing precipitation methods. In one precipitation method, hydrofluorosilicic acid is reacted with water to form a supersaturated solution in which silica particles are dissolved. Boric acid is continuously added to maintain a supersaturated solution and $SiO_2$ is precipitated out of solution at about room temperature. This technique requires that two compounds of silicon be used to form the $SiO_2$ layer.

To a large extent, the existing LPD methods have not solved the problems inherent with LTMOCVD. For the most part, the existing LPD techniques, such as sol-gel technology and precipitation methods, are limited to the formation of a relatively narrow group of film types. The limited film formation ability of existing LPD techniques relates, in part, to the requirement that the precursors have a specific chemical reactivity, and therefore, does not overcome the primary limitation of LTMOCVD. Accordingly, the development of an LPD technique which places few chemical reactivity requirements upon the precursors and which is capable of reliably forming of a large variety of film types is necessary to meet semiconductor manufacturing needs.

BRIEF SUMMARY OF THE INVENTION

In practicing the present invention there is provided a liquid phase deposition method for forming a material layer in a semiconductor device. The material layer is formed by the liquid-phase thermal decomposition of a metal-organic precursor dissolved in an anhydrous organic solvent. The thermal decomposition of the precursor breaks the chemical bonds within the precursor and releases the associated metal atom, or the associated metal oxide molecule, and forms a material layer on a semiconductor substrate immersed in the solution. In one embodiment of the invention, the precursor contains an associated metal selected from the group consisting of a transition metal, a group III-A metal, a group IV-A semiconductor metal or a group II-A metal. A semiconductor substrate is immersed in the liquid mixture and the precursor is thermally decomposed in the liquid phase at a temperature below the normal boiling point of the solvent to form the material layer on the substrate.

BRIEF DESCRIPTION OF THE DRAWING

The sole FIGURE is a schematic representation of an apparatus for carrying out the liquid phase deposition process in accordance with the invention.

DETAILED DESCRIPTION OF THE INVENTION

In the present invention a material layer is deposited on a semiconductor substrate during the fabrication of a semiconductor device. The material layer can be an electrically conductive layer such as a metal layer, a semiconductor layer, a super conductor layer, or alternatively, a non-conductive dielectric layer. The material layer is deposited by the liquid-phase thermal decomposition of a precursor dissolved in an anhydrous organic solvent. The precursor is a complex metal-organic compound comprising a transition metal, a group IV-A semiconductor metal, a group III-A metal or a group II-A metal coordinated by a number of organic ligands. The precursors are selected to have a high degree of steric hindrance present within the compound such that they will readily decompose upon being heated to a temperature not in excess of the normal boiling point of the organic solvent. A particular organic solvent is selected to have a molecular polarity similar to that of the chosen precursor in order to insure continuous dissolution of the precursor prior to delivery of the precursor to the deposition surface. The solution is heated to a temperature below the boiling point of the solvent and at a temperature sufficient to thermally decompose the precursor. Liquid phase deposition of the material layer is then carried out on the substrate surface by immersing one or more substrates in the solution.

As used herein, the term "substrate" refers to a semiconductor body upon which various electrically conductive and dielectric layers can be deposited, and upon which electronic components can be fabricated. Examples of electronic components include IC devices such as MOS and bipolar semiconductor devices formed on an N-type or P-type silicon body which may include buried oxide layers therein.

The art of precursor synthesis for use in thin film deposition is well developed with respect to the commercial availability of a wide variety of precursor materials, and any such precursor may potentially be used in the broad practice of the invention. In accordance with the invention, precursors are selected which can be solids or liquids at room temperature and standard atmospheric pressure, and which thermally decompose below the normal boiling point of one of a number of common organic solvents. A wide variety of known organic solvents can be used, representative examples include tetradecane (b.p. 254° C.), triethyleneglycol (b.p 278° C.), triethylenetetramine (bp. 266° C.) and the like. The selected precursors can be used to deposit a wide variety of material layers depending on the particular metal or metal oxide complex coordinated by the ligands, and the size and electronegativity of the substituents making up the ligands.

Given a certain degree of branching and electronegativity of a substituent, the bonding of the substituent to specific carbon atom in the complex molecule will influence the bond strength between the specified carbon atom and the chemical bonds adjacent to the specified carbon atom. If for example, the substituent is electrophillic, bonding electrons will be drawn away from the chemical bonds adjacent to the substituent bonding site thus weakening those bonds. Similarly, a highly branched substituent sterically hinders the molecule and places strain on the chemical bonds by forcing the bond angles away from a preferred low energy configuration. The steric hindrance introduced by the substitutent weakens the bonds within the complex molecule. Upon exposure to an elevated temperature, the complex molecule absorbs sufficient energy to break the chemical bonds between the metal atom and the associated ligands. A number of metal-organic complex molecules are known having ligands comprised of substituent groups which are sterically hindered and thus render the chemical bonds between the metal and carbon atoms relatively weak. In the case where the metal atom is bonded to oxygen atoms, the bond strength between the carbon and metal-associated oxygen atoms is reduced.

In one embodiment of the invention, metal substituted heterocyclic precursors, such as a metal coordinated β-diketonate complex, is used to form a metal layer on a semiconductor substrate. For example, a metal substituted acetylacetonate can be used having the general formula, $M(acac)_x$, where M is a transition metal or a group II-A metal, and x is the coordination number which is equal to one half the valence of the metal atom. The chemical structure and reactivity of β-diketonate complexes is described in, for example, "The Early Transition Metals", D. L. Kepert, Academic Press, New York, 1972. The acetylacetonate anion can have hydrocarbon and halogenated hydrocarbon substituents with the formula

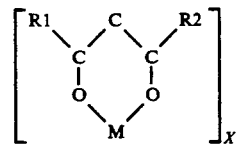

where R1 and R2 are alkyl, aryl, and trihaloalkyl and X is the coordination number. In the case where R1 is a branched hydrocarbon substituent and R2 is a fluorinated substituent, the combination of a branched hydrocarbon substituent and a highly electronegative fluorinated substituent both strains and weakens the bonds in the central ring portion of the molecule. Because a high degree of steric hindrance exists in these cyclic structures, the M-O bonds are rendered relatively week. When heated to a temperature of below the normal boiling point of one of the previously described organic solvents, but, above the decomposition temperature of the metal-organic precursor, the thermally induced rupturing of the metal bonds results in a source of free metal atoms in the solution. A substrate, when placed in the heated solution provides a site for the association of the free metal atoms which diffuse through the solution to the substrate surface. Once the metal deposition begins on the surface, the metal atoms themselves provide a combination site such that the reaction continues depositing successive layers of metal atoms eventually forming a uniformly thick layer.

The metal layer deposited on the substrate in accordance with the invention can be any suitable metal element having appropriate compatibility with and adhesion to the substrate and previously formed layers thereon. Illustrative metals include transition metals such as Pt, Ti, W, Pd, Co, Mo, Cr, Ta, Ni, Cu, Au and group III-A metals such as Al and Ga, group IV-A semiconductors metals such as Si and Ge and group II-A metals such as Ba. Under steady state conditions the decomposition rate of the precursor is constant; therefore, the final thickness of the metal layer is preferably determined by subjecting the substrate to the solution for a predetermined amount of time. It will be appreciated that the thickness of the metal layer may be varied widely to provide a metal layer most appropriately dimensioned for the intended application. By selection of two or more precursors containing different metal atoms, a metal alloy layer can be formed. For example, heterocyclic precursors of Ti and W can be jointly dissolved in solution and a Ti/W alloy layer deposited from the liquid phase.

It is important to note that the present invention is not limited to homogeneous and alloy metal film deposition and other materials, such as dielectric materials and superconducting materials, can be formed using the heterocyclic compounds described above. For example, dielectric layers such as barium titanate ($BaTiO_3$) can be formed using the metal substituted acetylacetonates described above. Furthermore, a superconductor material such as yttrium barium copper oxide (YBa$_2$Cu$_3$O$_{7-x}$), where x is less than 1, can be deposited from a solution containing predetermined concentrations of yttrium, barium and copper hexafluoroacetylacetonate.

In another embodiment of the invention, complex molecules such as metal alkyloxides are used as precursors to form dielectric material layers, including metal oxide dielectric materials such as lead lanthanum zirconium titanate (PLZT). For example, a metal oxide can be deposited on a substrate surface in a liquid phase using a metal alkoxides precursor such as those having the general formula M(OR)x, where M is a metal having the valence x and R is an alkyl or an aryl group substituent. Representative examples having a decomposition temperature below about 300° C. include [M(OBu$^t$)$_x$] and [M(OPr)$_x$] where Bu$^t$ is tertbutyl, Pr is propyl and M is a transition metal. For example, titanium iso-propoxide Ti(OPr)$_4$ can be used to deposit a TiO$_2$ film at about 180° to 240° C. For a description of the chemical activity of alkoxides precursors, see for example, "Metal Alkoxides as Precursors for Electronic and Ceramic Materials", D. C. Bradley, Chem. Rev. (89) 6, p 1317, 1989.

In a further embodiment of the invention, a group IV-A semiconductor material such as Si or Ge can be deposited by the liquid-phase thermal decomposition of a cyclic compound containing silicon. For example, a silicon layer can be formed using a precursor such as sila-5-spiro [4-4] nona-2,7-diene having the formula

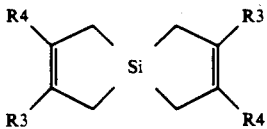

where R$^3$ and R$^4$ are hydrogen, alkyl and aryl. For a description of the chemical reactivity of silicon bicyclic dienes, see for example, "Mass-spectrometeric Investigation of the Thermal-Decomposition of Various Organosilicon Compounds in SiXCl-X(H) Chemical Vapor-Deposition", J. P. Gerault, J. Anal. Appl. Pyrolysis (4), p. 59, 1982.

The liquid phase decomposition technique of the present invention offers a number of advantages over conventional CVD film deposition and other liquid and colloidal film deposition methods such as precipitation, flash-evaporation, spin-on gels and the like. In the case of CVD, the precursors have to be selected such that the vapor pressures of the individual species are approximately equivalent. To meet this requirement, the particular molecules are often synthesized using complex processes to insure a precise molecular weight is obtained. An additional problem with CVD deposition is that often the precursors are solids or liquids at room temperature. In the case of a liquid precursors, the liquid must first be vaporized and maintained at a temperature above the condensation temperature at all times prior to delivery into the reaction chamber within the CVD system. In the case of a solid precursor, the solid must first be melted then vaporized which requires the delivery system to be maintained at a temperature high enough to prevent condensation and solidification of the precursor. These and other precursor requirements for CVD deposition limit the scope of the possible molecular precursors which can be used. In contrast, the LPD method of the present invention can employ a wide variety of precursors which are not limited by vapor pressure considerations. Moreover, certain precursor physical properties such as: existing as a solid at room temperature; having a high boiling point; and having a high molecular weight present a problem when using conventional CVD and LTMOCVD deposition methods. In contrast, these same physical properties are desirable characteristics in the precursors of the present invention.

In the prior art, dielectric layers have been formed by a sol-gel process in which an alkoxide is hydrolyzed to form gel. The gel is dispensed onto the surface of a substrate and the solvent and excess water in the gel is evaporated away. The requirement that the alkoxide undergo a hydrolization reaction limits the composition and structure of the alkoxides precursors to those which will readily hydrolyze to form the sol-gel. In contrast, when using a metal alkyloxide precursor to form a dielectric layer in accordance with the present invention, hydrolyzation of the precursor is not necessary; in fact, hydrolization is purposely avoided by using an anhydrous solvent.

Shown in the FIG. 1 is an exemplary apparatus for performing the liquid-phase deposition process of the present invention. A liquid bath 10 is adapted to hold a plurality of semiconductor substrates 12 which are supported on a side by a support member 14. Bath 10 is enclosed on the sides and bottom by a heating element 16 which maintains the solution in the bath at a temperature below the boiling point of the solvent. A recirculating pump 18 pumps solution through lines 20 into bath 10 and through a mixing unit 22 and a solvent makeup unit 24. In one embodiment in which the precursor is a solid at room temperature, the solid precursor is distributed over a dissolution bed within mixing unit 22 and the solvent is circulated through the bed until a solution having a predetermined molar concentration is obtained. Substrates 12 remain in the solution for a period of time sufficient to deposit a material layer of desired thickness on the surface of substrates 12.

It is important to note that the process of the present invention can be carried out using a variety of substrate materials and that substrates 12 can have numerous structures defined thereon. For example, as is conventional in a semiconductor fabrication procedure, a dielectric layer and patterned conductive layers overlying the dielectric layer can be formed on substrates 12 during prior processing steps. The substrates can then be placed in bath 10 and a material layer deposited thereon, the material layer being a conductive, superconductive or insulating layer. The deposition process will proceed irrespective of the particular material or structural configuration present on the surface of substrates 12.

By now it should be apparent that the present invention enables the use of a wide variety of precursors for the formation of an equally wide variety of material layers. One of skill in the art will recognize that given the need to form a material layer having specific physical characteristics, such as electrical conductivity and adhesion to a surface region on the semiconductor device, a number of precursor compounds having the desired elements and possessing a certain chemical polarity and decomposition temperature can be selected. An organic solvent is then chosen having a chemical polarity corresponding to the selected precursor and having a normal boiling point above the decomposition temperature of the selected precursor. Without further elaboration, it is believed that one skilled in the art can, using the preceding description, utilize the invention to its fullest extent. The following preferred specific embodiments are, therefore, to be construed as merely illustrative, and not limitative of the remainder of the disclosure in any way whatsoever.

EXAMPLE I

A layer of silicon is deposited using the apparatus shown in the FIGURE. A one molar solution comprising a sila-5-spiro [4-4] nona-2,7-diene as previously described dissolved in tetradecane (b.p. 254° C.) is circulated through the bath while maintaining the bath temperature in the range of 150° to 240° C. Because a considerable amount of steric hindrance exists in this cyclic structure, the Si-C bonds are relatively week. Upon thermal decomposition of the sila-5-spiro [4-4] nona-2,7-diene, a silicon layer 32 is deposited on gate oxide 32 having a thickness of about 50 to 500 nanometers.

EXAMPLE II

A mixed oxide material layer having the formula $YBa_2Cu_3O_{7-x}$, where x is less than one, is deposited using the apparatus shown in the FIGURE. The solution contains 0.5 mole of yttrium hexafluoroacetylacetonate ($YC_8H_{10}O_2F_3$), 2 moles of barium hexafluoroacetylacetonate ($BaC_8H_{10}O_2F_3$) and 3 moles of copper hexafluoroacetylacetonate ($CuC_8H_{10}O_2F_3$) dissolved in tetradecane (bp. 254° C.). The forgoing metal oxide compounds are commercially available and marketed by Strem Chemicals of Newburyport, Mass. The solution is circulated through the apparatus and the bath temperature is maintained in the range of 220° to 245° C. Upon thermal decomposition of the hexafluoroacetylacetonates, a layer of $YBa_2Cu_3O_{7-x}$ is deposited onto substrates 12 having a thickness of about 100 to 500 nanometers.

EXAMPLE III

A layer of copper is deposited on a substrate using the apparatus shown in the FIGURE. A mole of bis-(1,1,1,5,5,5-hexafluoro-2,4-pentanedionate) copper is dissolved in triethyleneglycol (b.p 278° C.). The solution is circulated through the apparatus and the bath temperature is maintained in the range of about 255° to 265° C. Upon thermal decomposition of the bis-(1,1,1,5,5,5-hexafluoro-2,4-pentanedionate) copper in the bath, a layer of copper having a thickness of about 100 to 1000 nanometers is deposited.

EXAMPLE IV

A BaTiO3 dielectric layer is deposited using the apparatus shown in the FIGURE. Equal one molar solutions of barium hexafluoroacetylacetonate and titanium hexafluoroacetylacetonate are prepared using either tetradecane, or triethyleneglycol as a solvent. The solution is circulated through the apparatus and the bath temperature is maintained in the range of about 230° to 245° C. A layer of BaTiO3 is formed on the substrates having a thickness of about 10 to 100 nanometers.

Thus it is apparent that there has been provided, in accordance with the invention, a method for forming a material layer in a semiconductor device using liquid phase deposition which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, a high pressure tank can be used to elevate the boiling temperature of solvent and thus carry out the deposition at a higher temperature to obtain a higher film deposition rate. Furthermore, the components of the liquid phase deposition apparatus can be arranged in a different order than shown. For example, the liquid deposition apparatus can have a substantially different configuration than the illustrated apparatus and may include multiple components such as several baths arranged in series and addition precursor introduction units. It is therefore intended to include within the invention all such variations and modifications as fall within the scope of the appended claims and equivalents thereof.

I claim:

1. A method for the liquid phase deposition of a material layer on a semiconductor substrate comprising:
    preparing a solution including a metal-organic precursor dissolved in an anhydrous organic solvent;
    circulating the solution through a constant-temperature bath wherein the bath temperature is maintained at or above the decomposition temperature of the metal-organic precursor;
    immersing the semiconductor substrate in the bath; and
    thermally decomposing the metal-organic precursor to deposit a material layer on the surface of the semiconductor substrate.

2. The method of claim 1 wherein the material layer is selected from the group consisting of an electrically conductive layer, a superconductive layer and a dielectric layer.

3. The method of claim 1 wherein the metal-organic precursor is a either a solid or a liquid at room temperature and standard pressure.

4. The method of claim 1 wherein the anhydrous organic solvent is selected to have a molecular polarity corresponding to that of the metal-organic precursor and a normal boiling point above the thermal decomposition of the metal-organic precursor.

5. A method for forming a material layer in a semiconductor device comprising:
    providing a liquid mixture containing a precursor dissolved in an anhydrous organic solvent, the precursor containing a metal selected from the group consisting of a transition metal, a group III-A metal, a group IV-A semiconductor metal, and group II-A metal;
    subjecting a semiconductor substrate to the liquid mixture; and
    thermally decomposing the precursor in the liquid phase at a temperature below the normal boiling point of the solvent to form the material layer on the substrate.

6. The method of claim 5 wherein the precursor is a coordination compound having ligands selected from the group consisting of a alkyloxide, a β-diketonate and a bi-cyclic diene.

7. The method of claim 6 wherein the organic solvent is selected from the group consisting of tetradecane, triethyleneglycol and triethylenetetramine.

8. The method of claim 5 wherein the material layer is selected from the group consisting of an electrically conductive layer, a superconductive layer and a dielectric layer.

9. The method of claim 8 wherein the electrically conductive layer is selected from the group consisting of W, Ti, Mo, Ta, Co, Pt, Cu, Au and alloys thereof.

10. The method of claim 8 wherein the electrically conductive layer is a semiconductor selected from the group consisting of Si and Ge.

11. The method of claim 8 wherein the dielectric layer is a transition metal oxide.

12. A method for forming a thin film selected from the group consisting of a transition metal, a transition metal oxide, a group IV-A semiconductor metal and a transition metal oxide on a semiconductor device comprising:

providing a liquid mixture containing a metal-coordinated organic precursor selected from the group consisting of a metal substituted acetylacetonate, a metal alkoxide and a group IV-A semiconductor metal substituted bi-cyclic diene dissolved in an organic solvent having a polarity corresponding to the dissolved metal-coordinated organic compound; and thermally decomposing the metal-coordinated organic compound in the liquid phase at a temperature below the boiling point of the solvent to form the thin film on an exposed surface of the semiconductor device.

13. The method of claim 12 wherein the metal substituted acetylacetonate has the following formula:

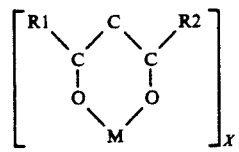

wherein M is selected from the group consisting of a transition metal and a group II-A metal;
X is the coordination number of M; and
R1 and R2 are each independently selected from the group consisting of alkyl, aryl and trihaloalkyl.

14. The method of claim 13 wherein:
the transition metal is selected from the group consisting of W, Ti, Mo, Ta, Co, Pt, Cu and Au; and
the group II-A metal is Ba.

15. The method of claim 12 wherein the bi-cyclic diene is a nona-2,7 diene having the following formula:

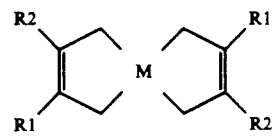

wherein: M is a group IV-A semiconductor metal; and
R1 and R2 are independently selected from the group consisting of hydrogen, alkyl or aryl.

16. The method of claim 15 wherein the group IV-A semiconductor metal is silicon.

17. The method of claim 12 wherein the metal alkoxide has the formula M(OR)x, wherein M is a transition metal having valence x and R is selected from the group consisting of tertbutyl and propyl.

18. The method of claim 17 wherein the transition metal is selected from the group consisting of W, Ti, Mo, Ta, Co, Pt, Cu and Au.

19. The method of claim 12 wherein the organic solvent is an anhydrous organic solvent selected from the group consisting of tetradecane, triethyleneglycol and triethylenetetramine.

* * * * *